United States Patent [19]
Kinsman et al.

[11] Patent Number: 5,375,320
[45] Date of Patent: Dec. 27, 1994

[54] METHOD OF FORMING "J" LEADS ON A SEMICONDUCTOR DEVICE

[75] Inventors: Larry D. Kinsman; Michael P. Grant; Gregory M. Chapman, all of Boise, Id.

[73] Assignee: Micron Technology, Inc., Boise, Id.

[21] Appl. No.: 895,766

[22] Filed: Jun. 9, 1992

Related U.S. Application Data

[62] Division of Ser. No. 744,602, Aug. 13, 1991, abandoned.

[51] Int. Cl.$^5$ ............................................. H01R 43/00
[52] U.S. Cl. ................................. 29/827; 174/52.4; 437/206; 437/217; 437/220
[58] Field of Search ................. 29/827; 174/52.4; 437/206, 217, 220

[56] References Cited

U.S. PATENT DOCUMENTS

| | | | |
|---|---|---|---|
| 4,553,420 | 11/1985 | Fierkens et al. | 29/827 X |
| 4,829,669 | 5/1989 | Nakajima | 29/827 X |
| 5,065,504 | 11/1991 | Olla | 29/827 |
| 5,074,139 | 12/1991 | Elliott | 29/827 X |
| 5,226,226 | 7/1993 | Fierkens | 29/827 |
| 5,263,242 | 11/1993 | Singh Deo et al. | 29/827 |

*Primary Examiner*—Carl J. Arbes
*Attorney, Agent, or Firm*—Kevin D. Martin

[57] ABSTRACT

A method for forming a small outline "J" lead for a semiconductor device having a main body and a lead comprises three bend steps. The lead comprises a surface attached to the body, a distal end away from the body, and a proximal area interposed between the attached surface and the distal end. The method consists of the lead bend steps of rounding the distal end of the lead in a single bend step to form an arc in the distal end having a radius of between 0.030" and 0.040", the arc terminating toward the proximal area of the leads in a substantially straight lead portion. Next, the proximal area of the lead is bent close to the attached surface such that the proximal area of the lead forms an angle of between about 60° and 90° with the attached surface of the lead. Finally, the arc in the distal end is increased to a radius of between about 0.035" and 0.045".

9 Claims, 8 Drawing Sheets

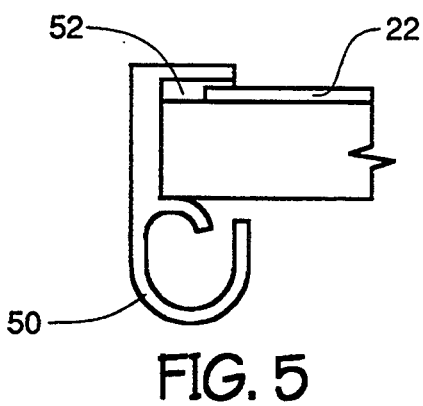
FIG. 5
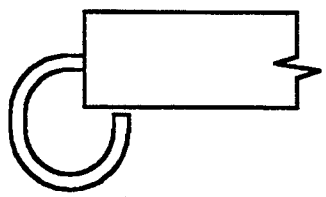 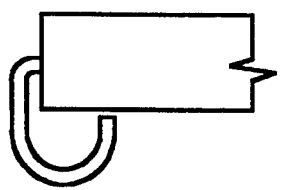 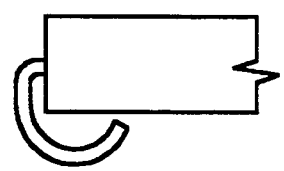
FIG. 6A     FIG. 6B     FIG. 6C

METHOD OF FORMING "J" LEADS ON A SEMICONDUCTOR DEVICE

This application is a division of U.S. patent application Ser. No. 07/744,602, filed Aug. 13, 1991, now abandoned.

FIELD OF THE INVENTION

This invention relates to the field of semiconductors. More specifically, a package type and method of forming same is described.

BACKGROUND OF THE INVENTION

Various types of semiconductor devices are manufactured in much the same way. A starting substrate, usually a thin wafer of silicon or gallium arsenide, is polished and the wafer is then masked, etched, and doped through several process steps, the steps depending on the type of devices being manufactured. This process yields a number of die on each wafer produced. The die are separated with a die saw, and then packaged into individual components.

The component package provides a means of input-/output between the semiconductor die and the electronic device into which the die is installed, thereby allowing the host to read and/or write information to and from the die. The package usually comprises a main body and conductive leads. The body, manufactured most commonly of plastic or ceramic, protects the fragile die encased inside the body from contact with objects or solvents that could physically damage or corrode the circuitry on the die surface. Bond pads on the die are coupled with the leads, and the leads exit the main body to the exterior of the package.

Many different package types are available on the market, each providing advantages for use in different circumstances. Dual In-Line Packages (DIPs) have two rows of leads which, when inserted into a printed circuit board (PCB), pass through holes in the PCB. Single In-line Packages (SIPs) have a single row of leads and also pass through holes in the board.

Surface mount packages are becoming widely used in industry, primarily because they are more easily handled by automated equipment than packages with through-hole leads, and they can be mounted to both sides of a PCB. The leads of surface mount packages do not pass through the PCB, but instead attach to its surface by means such as solder. "Gull Wing" and Small Outline J-Lead (SOJ, or J-leads) are two styles of surface mount packages.

Semiconductor packages, in addition to being processed from various materials and with different lead types can have different body styles, such as a "chip carrier" style. Ceramic bodies are often manufactured as a leadless chip carrier (LCC), which is a rectangular package having conductive pads along either edge. An LCC is typically soldered directly to the PCB, or leads are sometimes attached to the package before the die is mounted to the package, then the device is mounted on the PCB. A ceramic LCC is typically manufactured by a package supplier, and then delivered to a semiconductor manufacturer. The semiconductor manufacturer then attaches the semiconductor die to a surface of the package, attaches bond wires, and seals the package with a metal lid.

Another style of semiconductor body is a bottom brazed flat package, as shown in FIG. 1. This type of package has a notch 10 along the length of either edge of the package body which results from the bottom half of the package being narrower than the top half. The flat package has conductive pads 12 which extend from the upper vertical portion of the edge of the package to the horizontal portion of the notch 10. Leads 14 can then be brazed to either the conductive pads on the side 12A, or to the pads 12B on the top of the notch 10. A ceramic flat package is generally manufactured with the leads by a package supplier, then shipped to the semiconductor maker who places the package in a frame for handling to prevent damage to the leads. The semiconductor manufacturer installs a die in the package, attaches bond wires to electrically couple bond pads on the die to traces manufactured into the package, seals the die in the package with a metal lid, and then trims and forms the leads to produce a gull wing flat package device. FIG. 2 shows a flat package having gull wing leads 20 brazed to the portion of the conductive pads 12B on the top of the notch 10, and the lid 22 which is added after the die is bonded to the inside of the package.

Packages, as previously mentioned, are available with both plastic bodies and ceramic bodies. Often the same lead styles, for instance DIPs, are available with both plastic and ceramic bodies. The way the lead types are formed on the ceramic and plastic bodies, however, must often vary between the ceramic and plastic implementations. One reason for this is that the plastic bodies use a lead frame, while ceramic bodies often do not. In plastic encapsulation methods, the die is bonded to the lead frame, bond pads on the die are wire bonded to the leads on the lead frame, and then the die and a portion of the leads are encapsulated in plastic. The encapsulation step is generally performed by the semiconductor manufacturer. The leads of the device extend from the inside of the body to the outside, thereby allowing a means of I/O between the die and the host. In ceramic embodiments, the leads are usually attached by the package supplier by brazing them to the pads on the surface of the ceramic body before the die is inserted into the package, then the package is shipped to the semiconductor manufacturer. FIG. 3 shows a ceramic package having DIP leads 30 brazed to conductive pads 32 on the side of the package. The semiconductor manufacturer bonds the die 34 to a shelf 36 in the package body and bonds the pads 38 on the die 34 to bond pads 40 located on a second shelf 42. This couples the bond pads 38 on the die 34 with conductive traces (not shown) which extend through the ceramic body to the conductive pads 32 on the outside of the package, and to the leads 30.

J-leads are implemented with plastic bodies by forming the leads from a lead frame. The die is first bonded to the lead frame, bond wires are electrically interposed between the bond pads on the die and lead fingers on the lead frame, and the die and a portion of the leads are encapsulated in plastic. The leads are trimmed to the correct length and then formed into SOJ style leads.

The implementation of J-leads with ceramic bodies has taken several forms. A first method of forming J-leads on ceramic packages, as shown in FIG. 4, has been by side brazing the leads 44 on the conductive pads 32 along either side of the package body. While this type of J-lead provides a fairly low profile package, it has disadvantages. One disadvantage to this package is that the leads are attached to the package and formed by a package manufacturer before it is shipped to the semiconductor manufacturer. This requires that the package pass through assembly and test after the die is installed with the leads attached to the package, which makes it difficult to maintain lead coplanarity and can reduce yields from package defects.

One advantage of J-leads over other types of surface mount options such as LCC's is that J-leads are more resilient, as they allow more "spring" once they are attached to the PCB. This spring reduces problems of thermal mismatch between the PCB and the ceramic package, which can cause an open in the electrical connection between the die and the PCB. A J-lead which is brazed onto the vertical side of the package, however, has reduced resiliency over J-leads of plastic packages which exit the package and bend to form the J-lead. The curve of the lead is essential in maintaining the flexibility advantage of the J-lead, which is missing in the side brazed lead attachment means.

A second implementation of J-leads on a chip carrier involves attaching copper J-leads to the pads by thermocompression. The advantage of this package over one which is side brazed is that the leads are assembled after the device is assembled and tested, thereby reducing the number of rejects from damaged leads. To attach these leads after assembly of the module, however, requires a that the leads be relatively long, thereby providing a higher profile package than is desirable.

A third method of implementing J-leads, as shown in FIG. 5, uses "claw type" leads 50 which are snapped onto the package body, then soldered to the conductive pad (not shown). This process also produces a part with a high profile, and requires that an insulative material 52 be interposed between the clip 50 and the metal of the package lid 22 to prevent shorting of the leads 50 by the metal lid 22.

No reliable means of fabricating a J-lead using the flat package is yet available. As a result, the flat package is available mainly with gull wing style leads, which provides the surface mount capability and spring of the J-lead, but does not provide the small outline of the J-lead and therefore requires more space on the PCB.

The mechanical flexibility of the J-lead which provides protection against problems of thermal expansion is a result of its shape. In the plastic embodiment, the J-lead exits the package in a horizontal direction, has a rounded shoulder which bends the lead downward at approximately 90° to a vertical direction, and has a vertical section different lengths for different J-lead embodiments. The lead then curves inward toward the center of the package and usually bends back to the vertical direction toward the bottom of the package, although the lead may not reach the vertical direction in some embodiments. Several embodiments of J-leads are possible, and FIG. 6 shows a sampling of different J-lead styles.

J-leads which are side brazed, attached by thermocompression, or a claw type, have the disadvantages listed above, and further do not have the curved shoulder which gives a J-lead of a plastic package its resiliency. A J-lead on a flat package having a curved shoulder would have advantages over the J-lead mounted to the side of the chip carrier package by providing a better thermal expansion buffer between the PCB and the ceramic body. It would also have advantages over a gull wing flat package in that the outline would be smaller, thereby allowing for a smaller device footprint and more devices to be installed on a PCB.

SUMMARY OF THE INVENTION

An object of the invention is to provide a method of forming leads on a semiconductor device. This object of the invention is realized by forming a lead attached to a body of a semiconductor device, the lead having a surface attached to the body, a distal end away from the body, and a proximal area interposed between the attached surface and the distal end. The method consists of the lead bend steps of rounding the distal end of the lead in a single bend step to form an arc in the distal end, the arc terminating toward the proximal area of the leads in a substantially straight lead portion. Next, the proximal area of the lead is bent close to the attached surface. Finally, the arc in the distal end is increased in a single bend step to encroach on the proximal area thereby resulting in at least a portion of the proximal area forming a portion of the increased arc.

BRIEF DESCRIPTION OF THE DRAWINGS

FIG. 5 is a cross section of a chip carrier with claw type J-leads;

FIGS. 6A–6C are cross sections of three different shapes of J-leads;

DETAILED DESCRIPTION OF THE INVENTION

Figure 1:
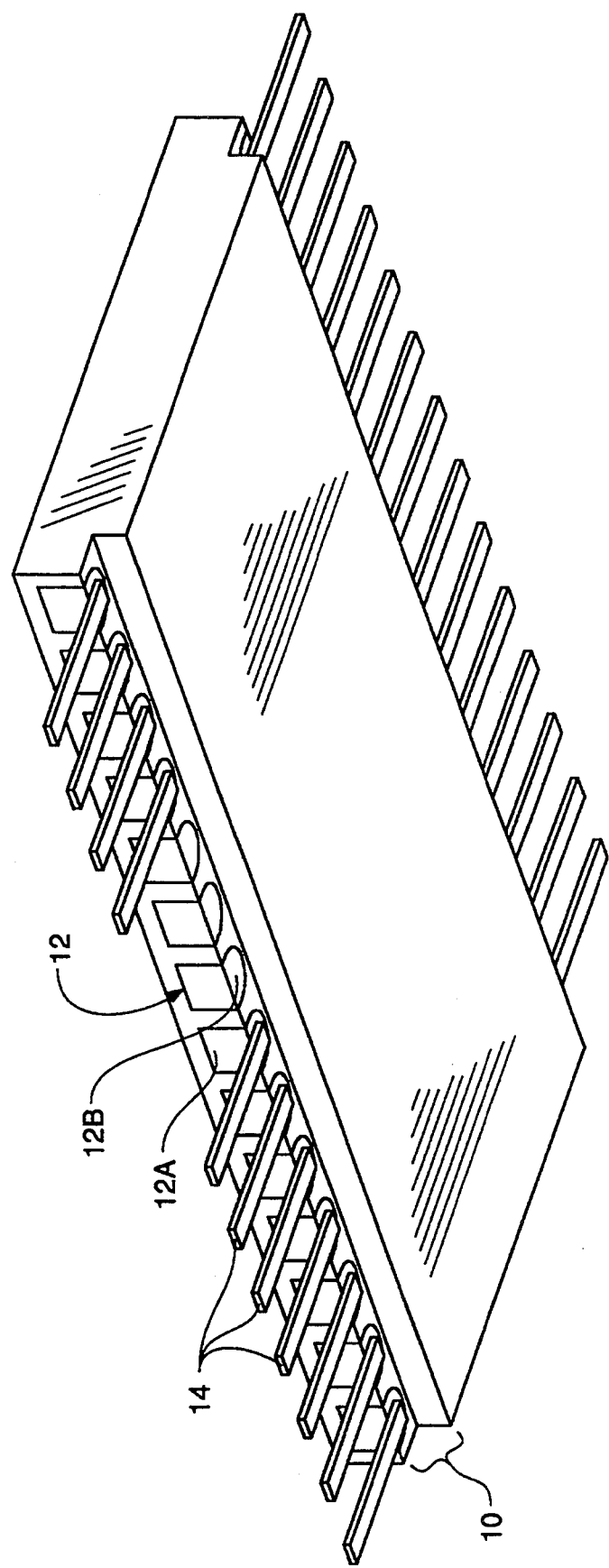
FIG. 1 is an isometric bottom view of a ceramic flat package comprising leads brazed to conductive pads on the underneath side of the notches along either side of the package.
Figure 2:
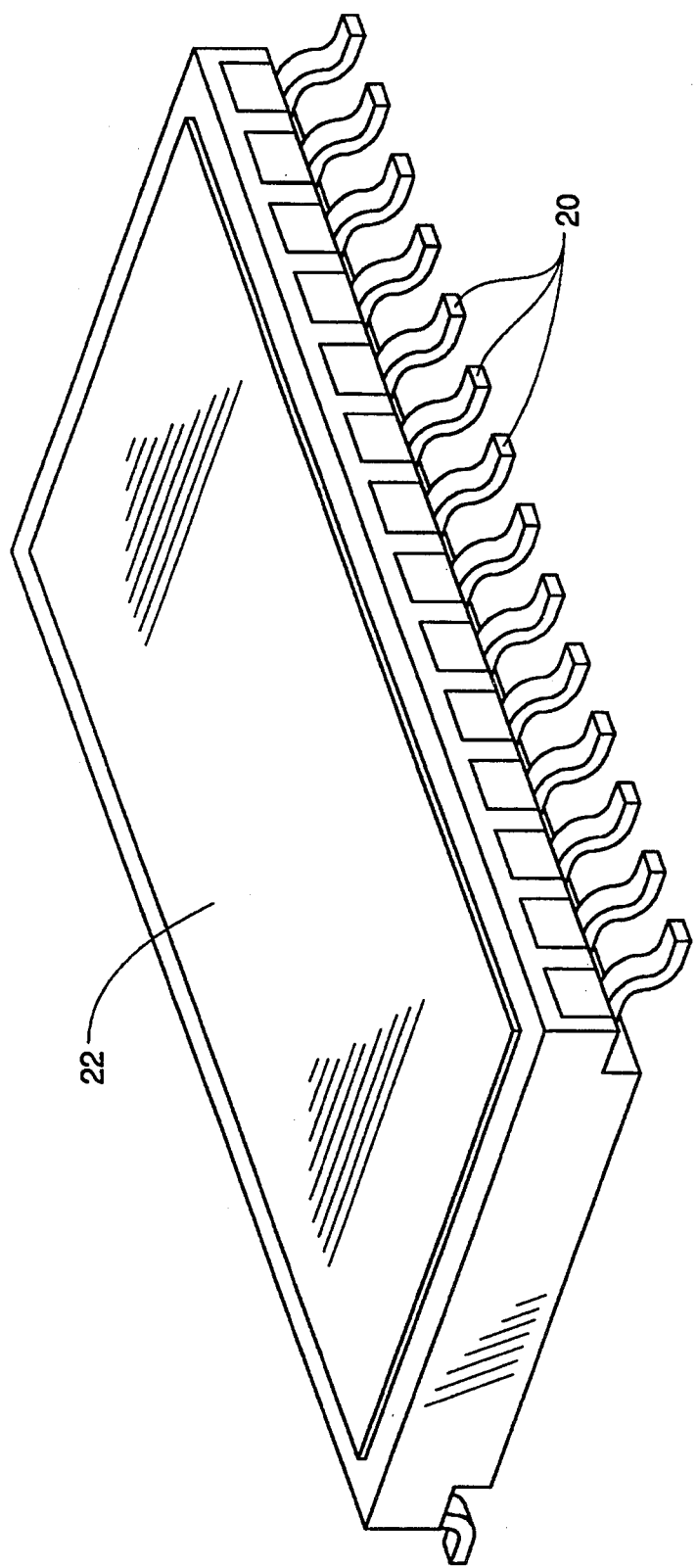
FIG. 2 is an isometric view of a gull wing flat package.
Figure 3:
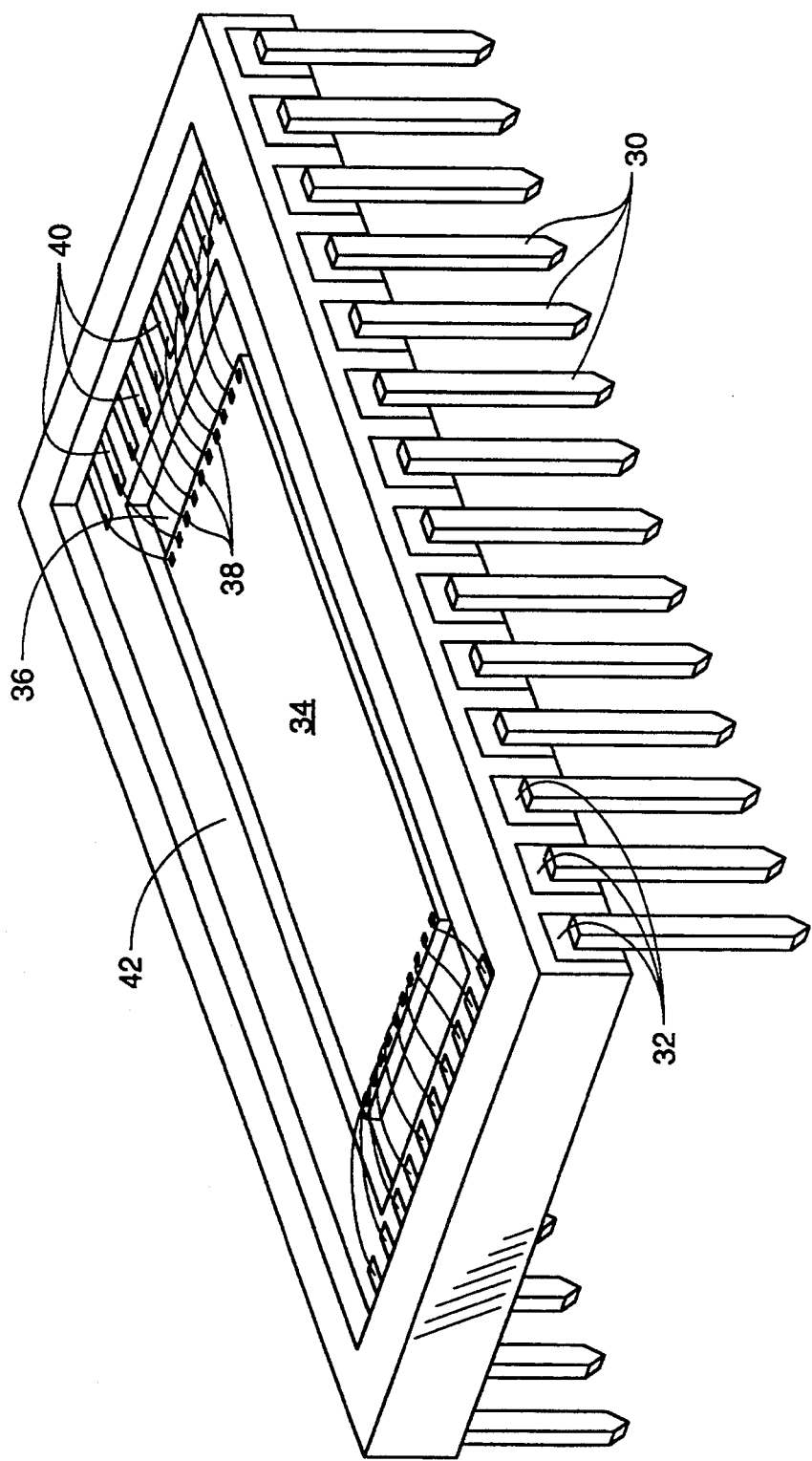
FIG. 3 is an isometric view of a ceramic dual in-line package with its lid removed to show the die and bond wires.
Figure 4:
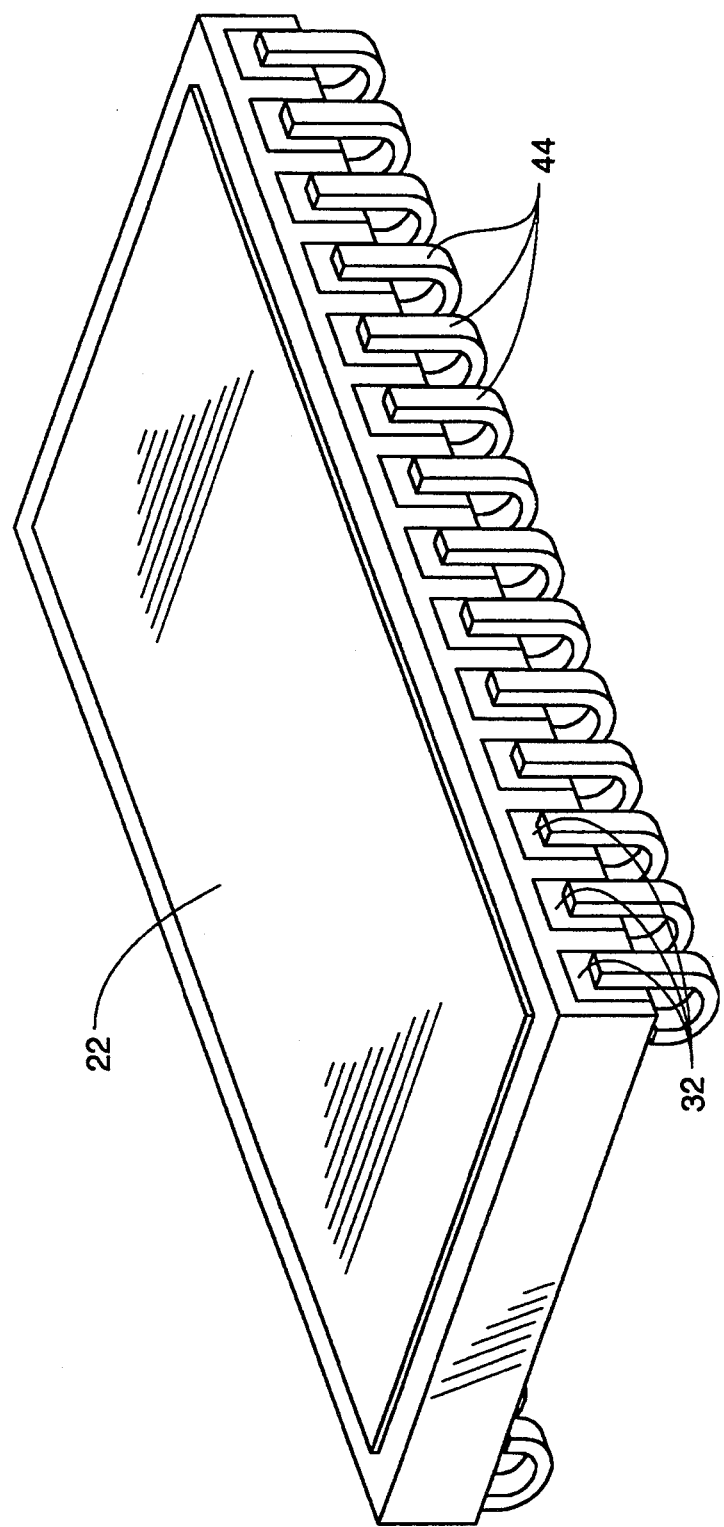
FIG. 4 is an isometric view of a chip carrier having J-leads brazed to the side of the package.
Figure 7A:
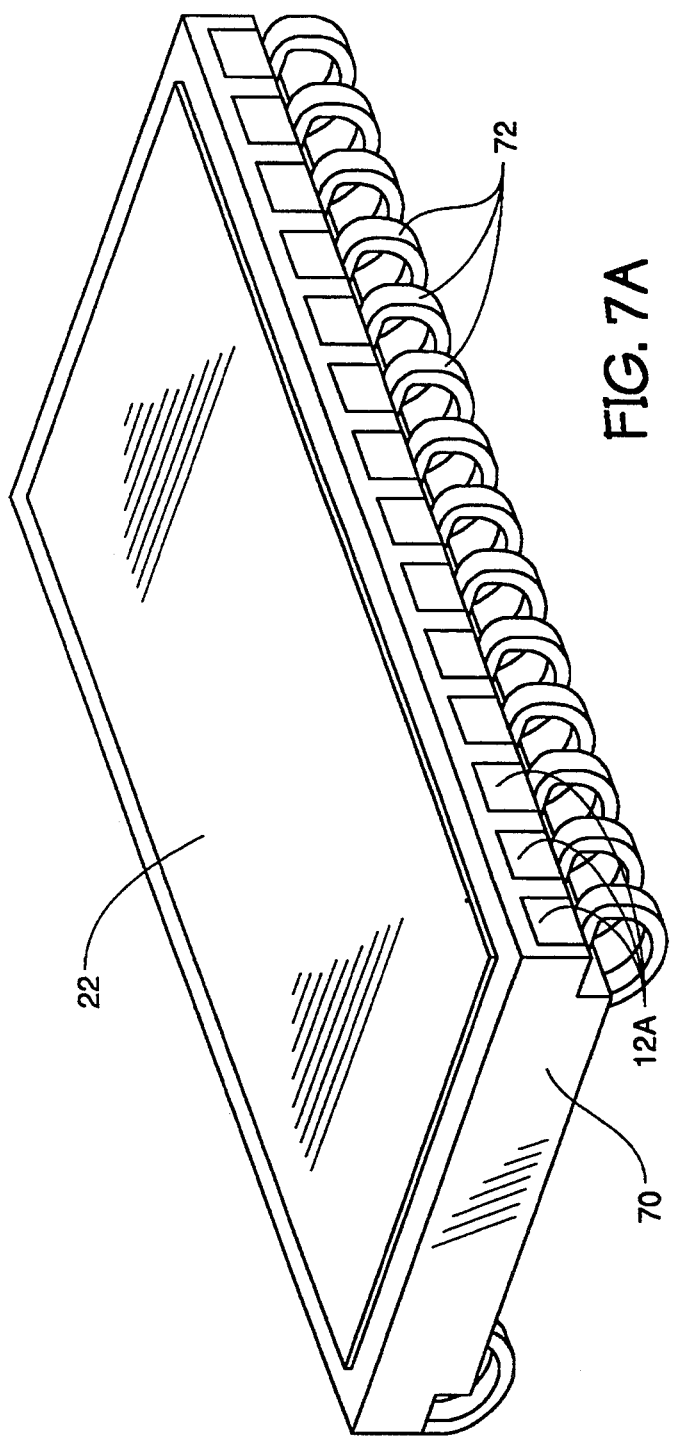
FIG. 7A is an isometric view of the inventive flat package comprising J-leads.
Figure 7B:
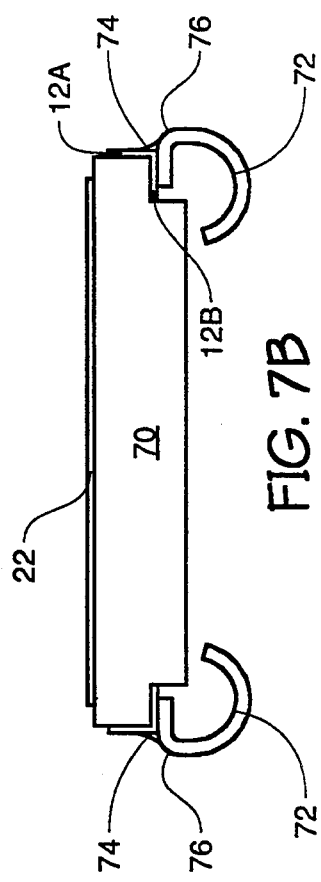
FIG. 7B is a cross section of the package of FIG. 7A.

FIG. 7A shows an isometric view, and FIG. 7B shows a cross section, of the inventive device. It comprises a body 70 and J-leads 72 which are electrically coupled to the conductive pad 12B on the horizontal surface of the notch on either side of the flat package with means such as brazing. An optional fillet of solder 74 supports the J-lead 72 and also serves to ensure coupling of the lead 72 with the conductive pad 12 of the body 70.

The J-lead as used with the invention has an advantage over J-leads which are side brazed to the ceramic package, in that they are more resilient and allow more "spring" than side brazed J-leads. This results from the curve 76 of the lead 72 as it descends from the horizontal portion of the notch on the package body. The characteristics of the J-leads of the inventive embodiment have the advantages of the J-lead of a plastic SOJ embodiment which uses a lead frame. In the plastic embodiment, the lead exits the plastic body and descends in a curve, then curves underneath the package. The spring afforded the device from the curve of the J-lead better protects the device from cracking or lead separation caused by the uneven expansion and contraction of the device and the PCB to which it is attached. As the PCB and devices are heated during operation of the host, they expand and contract at different rates which can cause in-circuit failures of the device. In addition, an inventive device has a lower profile than devices with leads which are side brazed, attached by thermocompression, or claw type. The invention is an advantage over gull wing style leads in that the inventive device has a smaller outline.

The inventive device can be formed from an inventive four-step process for forming the leads, Lead Trim, Lead Tip Curl, 70° Form, and Final Form as described below. The steps are listed as an example only, and are somewhat flexible as the shape of the J-leads themselves can vary and still be within specifications for J-lead shapes. Therefore, the description is for example purposes only and the invention is limited only by the appended claims.

The Lead Trim step shortens the leads of a flat package device having straight leads which extend perpendicular from the package. The leads are trimmed to a length depending on the specifications to which the J-leads will be formed.

The next three steps, which are lead form steps, form the trimmed leads to the proper specifications. The inventive method of forming the leads does not require the 90° bend step which is performed after the 70° bend step in conventional J-lead formation. This results from the highly flexible leads which are used with the ceramic flat package, and allows the leads to be bent to 90° during the Final Form step. This prevents the need for a dedicated 90° bend punch and anvil.

Figure 8:
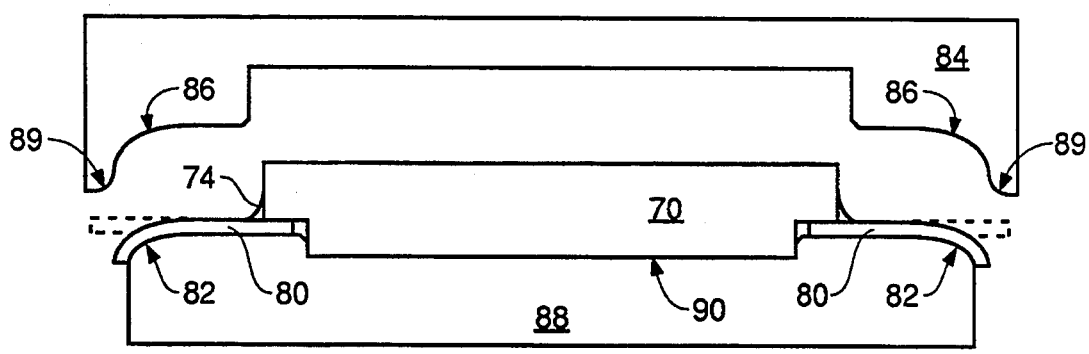
FIG. 8 is a cross section of the die punch and anvil used to curl the tips of the leads during the formation of the inventive package of FIG. 7.

The first form step, shown in FIG. 8, occurs after the leads 80 are trimmed to the required length. A 0.035" (inside radius) pre-bend 82 is performed on the tip of the lead 80 over an 80° arc from tip of the lead 80 to the point of tangency of the arc and the straight portion of the lead. The forming of the lead 80 is accomplished by a punch 84 with a 0.040" radius 86 contacting and bending the lead 80 over an anvil 88 with a 0.035" radius. This difference in size of the two radii leaves a gap of 0.005" between the punch 84 and anvil 88, which equals the thickness of the lead. The punch 84 has a lead-in radius 89 of 0.020", which permits a gradual bending of the lead 80 into the 0.040" radius without galling or scraping the leads. The lead tip bend is kept to less than 90° to reduce the likelihood of the leads sticking to the sides of the anvil 88 or scraping the plating off the leads. During the forming process the package 70 is located by the sides of the package, which fits into a nest 90 in the form anvil 88.

Figure 9:
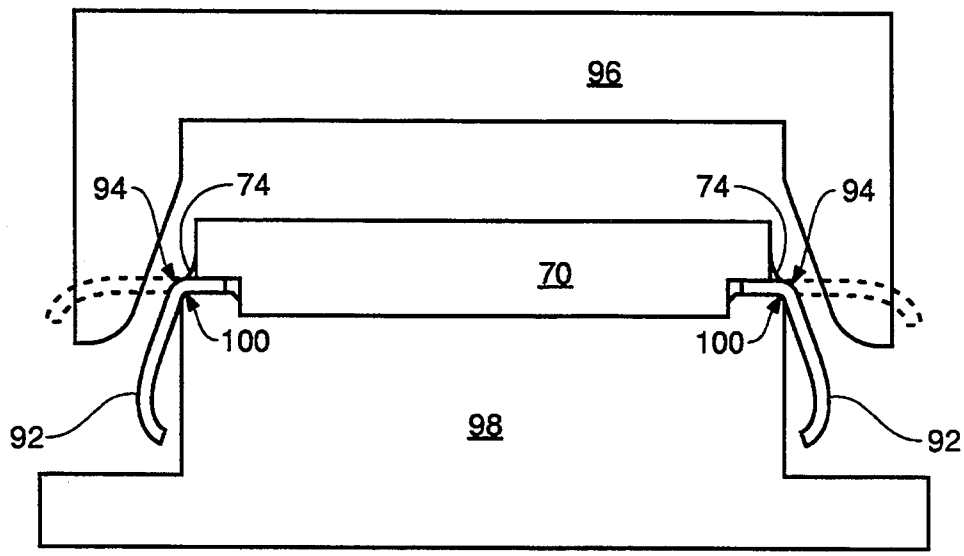
FIG. 9 is a cross section of the die punch and anvil used in the second step of forming the leads of the inventive package of FIG. 7.

The product is moved from the first form stage to the separate second form stage, shown in FIG. 9. The second form step, 70° Form, bends the leads 92 down at the end of the leads 92 at a point close to the package 70. The leads 92 are bent to form a shoulder 94 in the leads 92 at about the same position as, or a little wider than, is required for the final position of the J bend shoulder. The shoulder 94 is formed by a punch 96, which is machined at a 70° angle. This punch 96 drops over a form anvil 98, which has a 0.003" to 0.005" radius 100 for the shoulder 94 of the lead 92 to form over. At the closed position of the punch 96 and anvil 98, there remains a gap of 0.005" between the punch 96 and anvil 98 in the vicinity of the lead's shoulder 94, so that the lead 92 is not overstressed and so that plating material is not scrapped off of the leads 92. Again, the package 70 is located by its sides in this stage.

Figure 10:
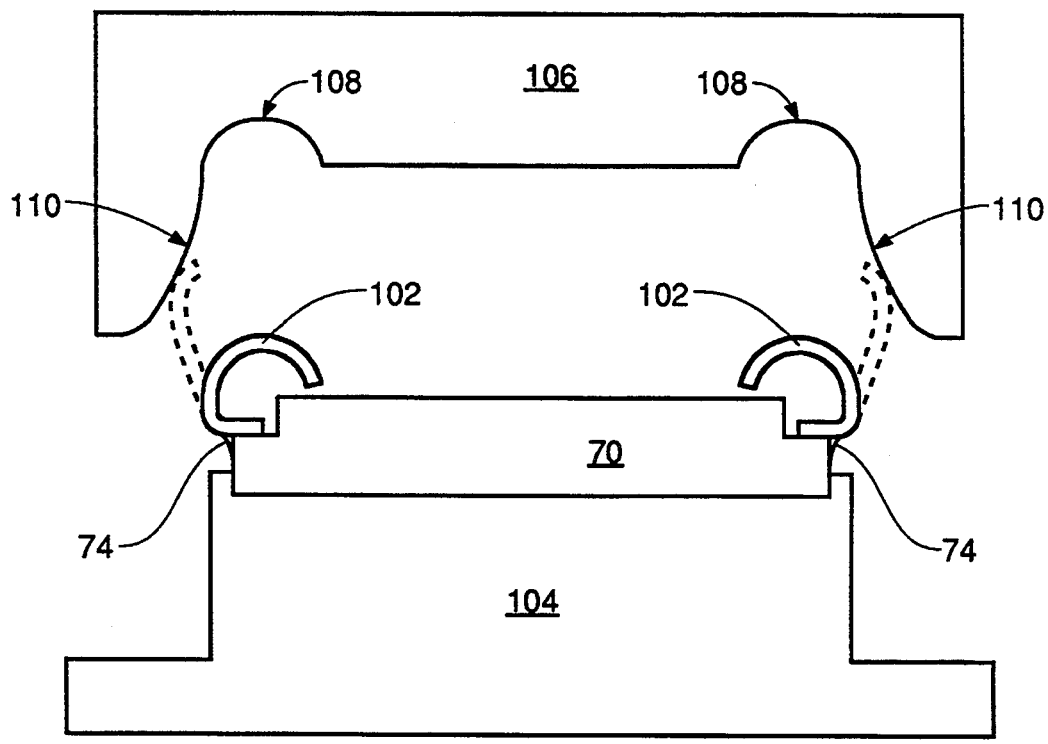
FIG. 10 is a cross section of the die punch and anvil used in the third step of forming the leads of the inventive package of FIG. 7.

The last step, Final Form, bends the leads 102 toward the bottom of the package 70 and further curves the ends of the leads toward the bottom of the package as shown in FIG. 10. The product is given this final net shape of the J bend by placing it in a form anvil 104, which nests the part or locates it by the sides of the package 70 while the final form punch 106 drops down onto the product to curl the leads 102. In the final form punch 106 are two polished grooves 108 of the same radius as is required for the final net shape of the J bend (0.040" in this case). These two grooves 108 have a lead-in 110 adjacent to each of them consisting of a large polished radius, which brings in the 70° formed leads gradually into about a 90° bend as the punch 106 is lowered onto the anvil 104. After the leads' shoulders are bent to a 90° angle, the grooves 108 in the final form punch 106 give the final curl to the leads 102 and establish the overall height and width of the package outline.

Note that the position of any of these anvils or punches can be inverted to achieve the same result, but pressure pins or some other supporting device such as a lead frame would have to be used to hold the product in place while forming the leads.

With the inventive method of forming the leads, all steps locate the device between the punches and anvils by aligning the device using points on the device package. In many cases, no pressure pads to clamp the shoulders of the device during lead formation are necessary but might be required to achieve a certain bend in the leads. Finally, no separate 90° bend step is required, as that bend is accomplished in the Final Form step.

We claim:

1. A method of forming a lead attached to a body of a semiconductor device, said lead having a surface attached to said body, a distal end away from said body, and a proximal area interposed between said attached surface and said distal end, consisting of the following lead bend steps:
   a) rounding said distal end of said lead in a single bend step to form an arc in said distal end, said arc terminating toward said proximal area of said leads in a substantially straight lead portion;
   b) in a single bend step, bending said proximal area of said lead close to said attached surface;
   c) in a single bend step, increasing said arc in said distal end to encroach on said proximal area thereby resulting in at least a portion of said proximal area forming a portion of said increased arc.

2. The method of claim 1 wherein said arc resulting from said step a) has a radius of between 0.030" and 0.040".

3. The method of claim 2 wherein step b) results in the formation of an angle of between 60° and 90° as defined by said attached surface and said proximal area.

4. The method of claim 1 wherein said step b) results in the formation of an angle of about 70° as defined by said attached surface and said proximal area.

5. The method of claim 3 wherein said step c) results in said lead having an arc with a radius of between 0.035" and 0.045".

6. The method of claim 1 wherein said surface attached to said body is not clamped during said lead forming.

7. A method of forming a lead attached to a body of a semiconductor device, said lead having a surface attached to said body, a distal end away from said body, and a proximal area interposed between said attached surface and said distal end, consisting of the following lead bend steps:
   a) rounding said distal end of said lead in a single bend step to form an arc in said distal end having a radius of between 0.030" and 0.040", said arc terminating toward said proximal area of said leads in a substantially straight lead portion;
   b) in a single bend step, bending said proximal area of said lead close to said attached surface such that said proximal area of said lead forms an angle of between about 60° and 90° with said attached surface of said lead;
   c) in a single bend step, increasing said arc in said distal end to a radius of between about 0.035" and 0.045".

8. The method of claim 7 wherein said step b) results in the formation of an angle of about 70° as defined by said attached surface and said proximal area.

9. The method of claim 7 wherein said surface attached to said body is not clamped during said lead forming.

* * * * *